US012733288B2

(12) United States Patent
Oomori et al.

(10) Patent No.: US 12,733,288 B2
(45) Date of Patent: Sep. 8, 2026

(54) SOLID-STATE IMAGING APPARATUS, MANUFACTURING METHOD THEREOF, AND ELECTRONIC EQUIPMENT

(71) Applicant: SONY SEMICONDUCTOR SOLUTIONS CORPORATION, Kanagawa (JP)

(72) Inventors: Hiroki Oomori, Kanagawa (JP); Nobutoshi Fujii, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 309 days.

(21) Appl. No.: 18/556,906

(22) PCT Filed: Feb. 2, 2022

(86) PCT No.: PCT/JP2022/003950
§ 371 (c)(1),
(2) Date: Oct. 24, 2023

(87) PCT Pub. No.: WO2022/239325
PCT Pub. Date: Nov. 17, 2022

(65) Prior Publication Data

US 2024/0222410 A1 Jul. 4, 2024

(30) Foreign Application Priority Data

May 11, 2021 (JP) ................................ 2021-080318

(51) Int. Cl.
*H01L 27/146* (2006.01)
*H10F 39/00* (2025.01)

(52) U.S. Cl.
CPC ......... *H10F 39/811* (2025.01); *H10F 39/026* (2025.01)

(58) Field of Classification Search
CPC . H01L 21/3205; H01L 21/768; H01L 23/522; H01L 25/065; H01L 25/07;
(Continued)

(56) References Cited

U.S. PATENT DOCUMENTS

| | | | | |
|---|---|---|---|---|
| 10,879,292 | B2 * | 12/2020 | Jang | H10F 39/804 |
| 2014/0145338 | A1 * | 5/2014 | Fujii | H10W 20/40 257/762 |

(Continued)

FOREIGN PATENT DOCUMENTS

| | | |
|---|---|---|
| JP | 2012-256736 A | 12/2012 |
| JP | 2013-168623 A | 8/2013 |

(Continued)

OTHER PUBLICATIONS

International Search Report and Written Opinion of PCT Application No. PCT/JP2022/003950, issued on Apr. 26, 2022, 09 pages of ISRWO.

*Primary Examiner* — Jaehwan Oh
(74) *Attorney, Agent, or Firm* — CHIP LAW GROUP

(57) ABSTRACT

The present disclosure relates to a solid-state imaging apparatus, a manufacturing method thereof, and electronic equipment that are able to suppress nonuniform reflection of incident light. The solid-state imaging apparatus includes an imaging element chip and a device chip. The imaging element chip has a semiconductor substrate. The device chip is bonded to a wiring layer opposite the light incident surface of the semiconductor substrate. The device chip is disposed in a pixel region of the imaging element chip. The wiring layer of the imaging element chip includes a dummy metal wiring in a region where the device chip of the pixel region is not disposed. The technology according to the present disclosure is applicable, for example, to the solid-state
(Continued)

imaging apparatus that is formed by bonding the imaging element chip to the device chip.

16 Claims, 14 Drawing Sheets

(58) Field of Classification Search
CPC ....... H01L 25/18; H04N 25/70; H10F 39/018; H10F 39/026; H10F 39/12; H10F 39/809; H10F 39/811
See application file for complete search history.

(56) References Cited

U.S. PATENT DOCUMENTS

| | | | | |
|---|---|---|---|---|
| 2014/0367853 | A1* | 12/2014 | Tsukimura | H10F 39/809<br>257/737 |
| 2016/0233264 | A1* | 8/2016 | Kagawa | H10F 39/811 |
| 2017/0229503 | A1* | 8/2017 | Suzuki | H10F 39/8057 |
| 2018/0040658 | A1* | 2/2018 | Kang | H10F 39/809 |
| 2020/0035737 | A1* | 1/2020 | Ito | H10F 39/809 |
| 2020/0035739 | A1* | 1/2020 | Saito | H10F 39/809 |
| 2020/0091215 | A1* | 3/2020 | Jang | H10F 39/804 |
| 2020/0258924 | A1* | 8/2020 | Takachi | H10F 39/199 |
| 2021/0005658 | A1* | 1/2021 | Yukawa | H10F 39/809 |

FOREIGN PATENT DOCUMENTS

| | | | |
|---|---|---|---|
| WO | 2019/087764 | A1 | 5/2019 |
| WO | 2019/181222 | A1 | 9/2019 |

* cited by examiner

SUPPORT SUBSTRATE
14

23
24

25D
28a
28a
28a
27
25X
82
CHIP OUTSIDE REGION
CHIP REGION
26
25D 42D
43
28b
28a
83
42X
25D
28a
25X
82
CHIP OUTSIDE REGION
CHIP REGION 28a
28b
42D
43
61
83
42X
25X
82
28a 81
81
42D
61
62

FIG. 10

SUPPORT SUBSTRATE

Figure 13:
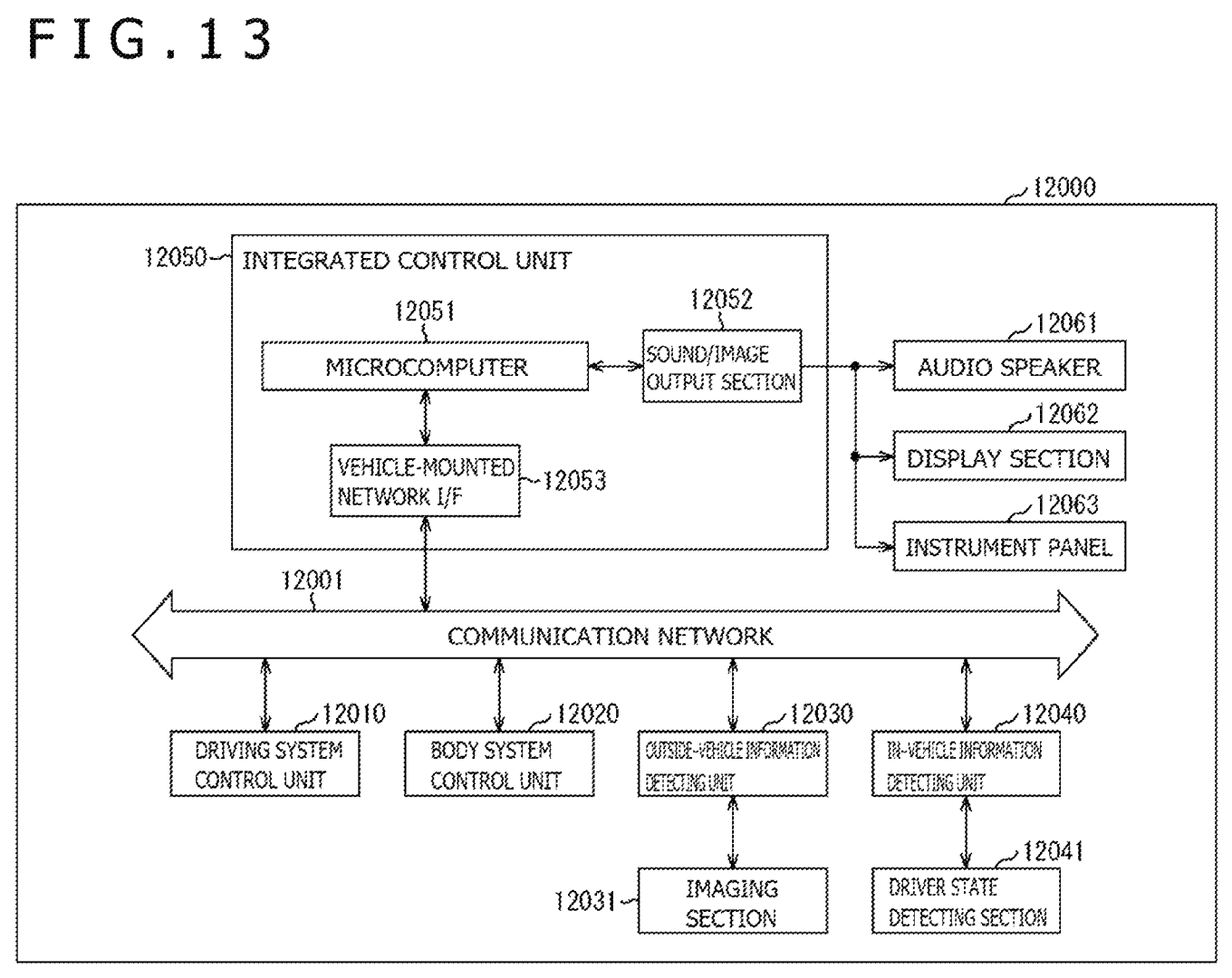

INTEGRATED CONTROL UNIT
12050
MICROCOMPUTER
12051
SOUND/IMAGE OUTPUT SECTION
12052
VEHICLE-MOUNTED NETWORK I/F
12053
AUDIO SPEAKER
12061
DISPLAY SECTION
12062
INSTRUMENT PANEL
12063
COMMUNICATION NETWORK
12001
DRIVING SYSTEM CONTROL UNIT
12010
BODY SYSTEM CONTROL UNIT
12020
OUTSIDE-VEHICLE INFORMATION DETECTING UNIT
12030
IMAGING SECTION
12031
IN-VEHICLE INFORMATION DETECTING UNIT
12040
DRIVER STATE DETECTING SECTION
12041

SOLID-STATE IMAGING APPARATUS, MANUFACTURING METHOD THEREOF, AND ELECTRONIC EQUIPMENT

CROSS REFERENCE TO RELATED APPLICATIONS

This application is a U.S. National Phase of International Patent Application No. PCT/JP2022/003950 filed on Feb. 2, 2022, which claims priority benefit of Japanese Patent Application No. JP 2021-080318 filed in the Japan Patent Office on May 11, 2021. Each of the above-referenced applications is hereby incorporated herein by reference in its entirety.

TECHNICAL FIELD

The present disclosure relates to a solid-state imaging apparatus, a manufacturing method thereof, and electronic equipment, and more particularly relates to a solid-state imaging apparatus, a manufacturing method thereof, and electronic equipment that are able to suppress nonuniform reflection of incident light.

BACKGROUND ART

An imaging element formed by bonding a chip, such as a logic IC chip or a memory IC chip, to the circuit surface opposite the light incident surface of an imaging element chip is proposed for the purpose of providing high functionality of the imaging element (refer, for instance, to PTL 1).

CITATION LIST

Patent Literature

PTL 1

PCT Patent Publication No. WO 2019/087764

SUMMARY

Technical Problem

When a structure disclosed in PTL 1 is employed to bond a separate chip to the circuit surface of an imaging element chip, variations may occur in the reflection of light incident on the imaging element chip, resulting in nonuniform reflection of the incident light.

The present disclosure has been made in view of the above circumstances and is intended to suppress nonuniform reflection of incident light.

Solution to Problem

According to a first aspect of the present disclosure, there is provided a solid-state imaging apparatus including an imaging element chip and a device chip. The imaging element chip has a semiconductor substrate. The device chip is bonded to a wiring layer opposite the light incident surface of the semiconductor substrate. The device chip is disposed in a pixel region of the imaging element chip. The wiring layer of the imaging element chip includes a dummy metal wiring that is positioned in a region where the device chip of the pixel region is not disposed.

According to a second aspect of the present disclosure, there is provided a manufacturing method of a solid-state imaging apparatus. The manufacturing method includes the steps of bonding a device chip to a pixel region of a wiring layer opposite the light incident surface of a semiconductor substrate for an imaging element chip, and forming a dummy metal wiring in a region where the device chip of the pixel region is not disposed.

According to a third aspect of the present disclosure, there is provided electronic equipment including a solid-state imaging apparatus. The solid-state imaging apparatus includes an imaging element chip and a device chip. The imaging element chip has a semiconductor substrate. The device chip is bonded to a wiring layer opposite the light incident surface of the semiconductor substrate. The device chip is disposed in a pixel region of the imaging element chip. The wiring layer of the imaging element chip includes a dummy metal wiring in a region where the device chip of the pixel region is not disposed.

According to the first to third aspects of the present disclosure, the device chip is bonded to the pixel region of the wiring layer opposite the light incident surface of the semiconductor substrate for the imaging element chip, and the dummy metal wiring is formed in a region where the device chip of the pixel region is not disposed.

The solid-state imaging apparatus and the electronic equipment may be an independent apparatus or may be a module to be incorporated in a separate apparatus.

BRIEF DESCRIPTION OF DRAWINGS

FIGS. 4A and 4B are set of diagrams illustrating the effect produced by the dummy vias in the solid-state imaging apparatus depicted in FIG. 1.

FIG. 10 is a cross-sectional view illustrating the solid-state imaging apparatus according to a third embodiment of the present disclosure.

FIG. 13 is a block diagram depicting an example of schematic configuration of a vehicle control system.

DESCRIPTION OF EMBODIMENT

Figure 1:
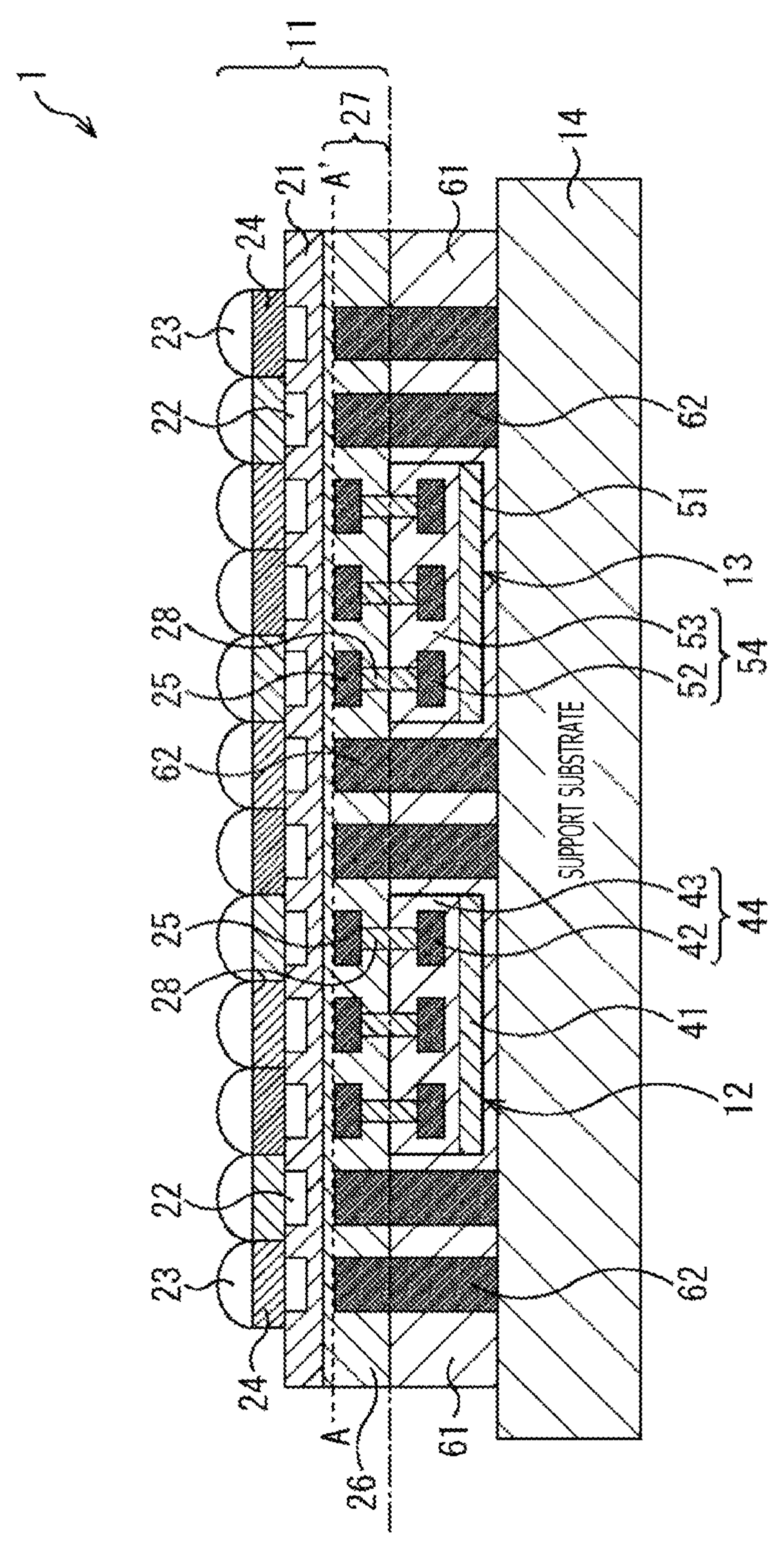
FIG. 1 is a cross-sectional view illustrating a solid-state imaging apparatus according to a first embodiment of the present disclosure.

Embodiments for implementing a technology according to the present disclosure (hereinafter referred to as the embodiments) will now be described with reference to the accompanying drawings. The description will be given in the following order.

1. First Embodiment of Solid-state Imaging Apparatus
2. Manufacturing Method of Solid-state Imaging Apparatus
3. Modification of First Embodiment
4. Second Embodiment of Solid-state Imaging Apparatus
5. Third Embodiment of Solid-state Imaging Apparatus
6. Example Uses of Image Sensor
7. Example Applications to Electronic Equipment
8. Example Applications to Mobile Bodies It should be noted that, in the drawings referred to in the subsequent description, component elements identical or similar to each other are designated by identical or similar reference signs. However, the drawings are schematic. Therefore, for example, the relation between thicknesses and planar dimensions and the thickness ratio between individual layers are different from real ones. Further, in some cases, some parts depicted in the drawings differ from each other in dimensional relation or ratio.

Furthermore, definitions of upward, downward, and other directions mentioned in the subsequent description are merely formulated for convenience of explanation and are not intended to limit the technological idea of the present disclosure. For example, when a target is rotated 90 degrees and observed, an up-down direction is read as a left-right direction, and when the target is rotated 180 degrees and observed, the up-down direction is read as a reversed up-down direction.

1. First Embodiment of Solid-State Imaging Apparatus

FIG. 1 is a cross-sectional view illustrating a solid-state imaging apparatus according to a first embodiment of the present disclosure.

The solid-state imaging apparatus 1 depicted in FIG. 1 has a layered structure in which a logic chip 12 and a memory chip 13 are directly bonded, as sub-chips, to an imaging element chip 11, that is, a main chip. The logic chip 12 and the memory chip 13 are device chips smaller in size than the imaging element chip 11. The one-dot chain line depicted in FIG. 1 indicates bonding surfaces between the imaging element chip 11 and the logic and memory chips 12 and 13. The layered structure formed by the imaging element chip 11, the logic chip 12, and the memory chip 13 is connected to a support substrate 14.

The imaging element chip 11 includes, for example, a back-illuminated CMOS (Complementary Metal Oxide Semiconductor) image sensor. The imaging element chip 11 is configured such that a photodiode 22 acting as a photoelectric conversion section is formed pixel by pixel on a semiconductor substrate 21. The semiconductor substrate 21 uses, for example, silicon (Si) as a semiconductor. An on-chip lens 23 and a color filter 24 are formed pixel by pixel toward the light incident surface of the semiconductor substrate 21 which is the upper surface depicted in FIG. 1. A wiring layer 27 including a metal wiring 25 and an insulating layer 26 is formed toward the circuit formation surface of the semiconductor substrate 21 which is the lower surface depicted in FIG. 1 and positioned opposite the light incident surface.

Meanwhile, the logic chip 12 is configured such that a wiring layer 44 including a metal wiring 42 and an insulating layer 43 is formed on the front surface of a semiconductor substrate 41. The semiconductor substrate 41 uses, for example, silicon (Si) as a semiconductor. The front surface of the semiconductor substrate 41 is positioned toward the imaging element chip 11. The metal wiring 42 in the wiring layer 44 is connected through a contact wiring 28 to the metal wiring 25 of the imaging element chip 11 which is disposed at a position facing the metal wiring 42. As described later, the metal wiring 25 and the metal wiring 42 which are connected through the contact wiring 28 is, in some cases, a connection wiring for transmitting and receiving power or signals between the imaging element chip 11 and the logic chip 12, and, in some other cases, a dummy wiring that does not transmit and receive power or signals between the imaging element chip 11 and the logic chip 12.

The memory chip 13 is configured such that a wiring layer 54 including a metal wiring 52 and an insulating layer 53 is formed on the front surface of a semiconductor substrate 51. The semiconductor substrate 51 uses, for example, silicon (Si) as a semiconductor. The front surface of the semiconductor substrate 51 is positioned toward the imaging element chip 11. The metal wiring 52 in the wiring layer 54 is connected through the contact wiring 28 to the metal wiring 25 of the imaging element chip 11 which is disposed at a position facing the metal wiring 52. As described later, the metal wiring 25 and the metal wiring 52 which are connected through the contact wiring 28 include, in some cases, a connection wiring for transmitting and receiving power or signals between the imaging element chip 11 and the memory chip 13, and, in some other cases, a dummy wiring that does not transmit and receive power or signals between the imaging element chip 11 and the memory chip 13.

An insulating layer 61 and a dummy via 62 are formed between the imaging element chip 11 and the support substrate 14 except for a region where the logic chip 12 and the memory chip 13 are connected. The dummy via 62 is a dummy metal wiring that is formed with the same plane size and the same pitch (interval) as the metal wiring 25 formed in the wiring layer 27 of the imaging element chip 11. The dummy via 62 is a metal wiring whose surface area in a plane parallel to the semiconductor substrate 21 is equal to that of the metal wiring 25 and is formed to a position deeper than the depth (thickness) of the logic chip 12 and memory chip 13.

Figure 2A:
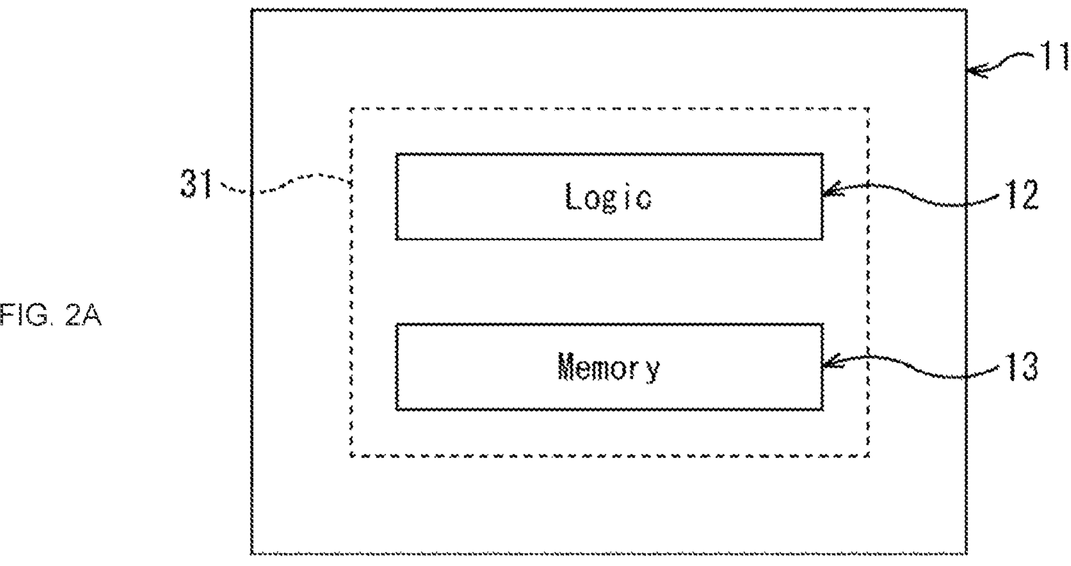
FIGS. 2A and 2B are set of predetermined plan views illustrating the solid-state imaging apparatus depicted in FIG. 1.

FIG. 2A is a plan view illustrating the arrangement of the logic chip 12 and memory chip 13 that are bonded to the imaging element chip 11. Part A of FIG. 2A is a plan view illustrating the imaging element chip 11, the logic chip 12, and the memory chip 13 as viewed from the support substrate 14.

A region inside a rectangular dashed line within the imaging element chip 11 depicted in FIG. 2A indicates a pixel region 31 where multiple pixels including, for example, the photodiode 22 and the on-chip lens 23 are arrayed in a matrix. Therefore, the logic chip 12 and the memory chip 13 are disposed in a region directly below the pixel region 31, that is, superimposed over the pixel region 31.

Figure 2B:
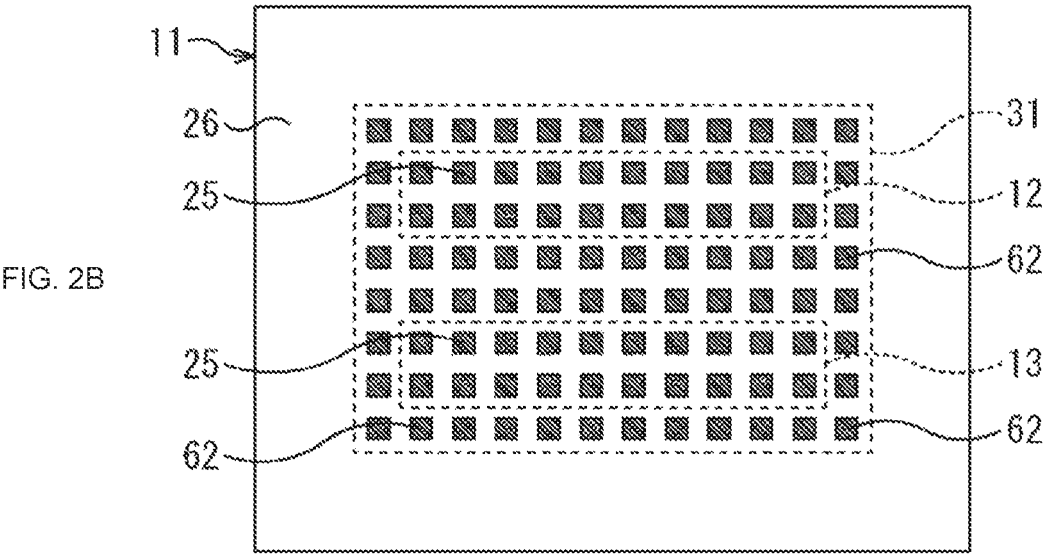

FIG. 2B is a plan view taken along line A-A' in FIG. 1, which corresponds to the upper surface of the metal wiring 25. In FIG. 2B, the pixel region 31 and the regions of the logic chip 12 and memory chip 13 are indicated by dashed lines.

As depicted in FIG. 2B, the multiple metal wirings 25 are formed, with the same plane size and the same pitch, in a region within the pixel region 31 where the logic chip 12 and the memory chip 13 are disposed (hereinafter referred to also as the chip superimposition region). Further, the multiple dummy vias 62 are formed, with the same plane size and the same pitch as the metal wirings 25, in a region other than the chip superimposition region within the pixel region 31. Therefore, the metal wirings 25 and the dummy vias 62 are formed, with the same plane size and the same pitch, in the whole pixel region 31. The percentage of area occupied by the dummy vias 62 in a region other than the chip superimposition region within the pixel region 31 (the coverage of the dummy vias 62) is equivalent to the percentage of area occupied by the metal wirings 25 in the chip superimposition region within the pixel region 31 (the coverage of the metal wirings 25). Here, the equivalent percentages represent levels that can be considered substantially equal in a situation where component elements designed and manufactured to be equal in percentage are within the allowable error range of a manufacturing process.

Figure 3:
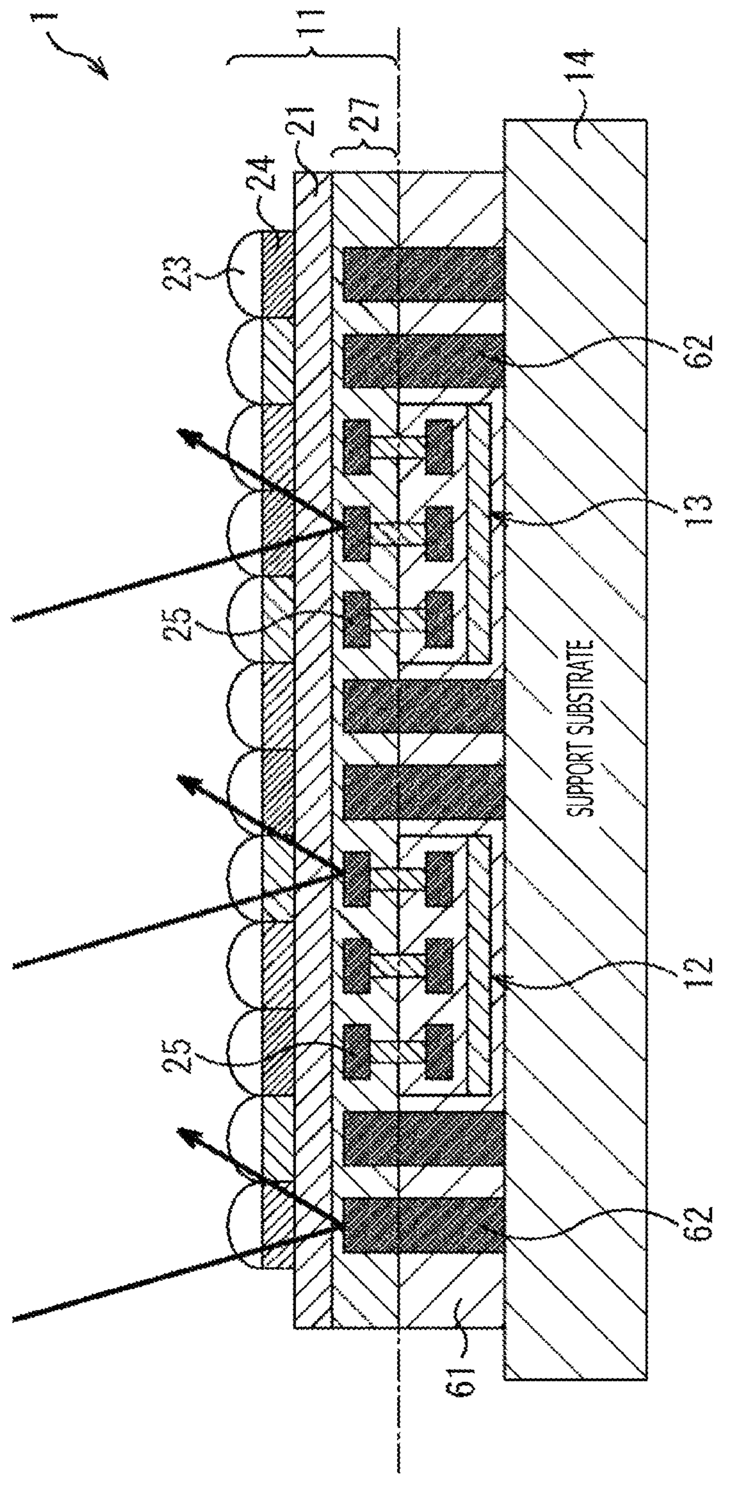
FIG. 3 is a diagram illustrating an effect produced by dummy vias in the solid-state imaging apparatus depicted in FIG. 1.

As described above, the solid-state imaging apparatus 1 is configured such that the multiple dummy vias 62 are formed, with the same plane size and the same pitch as the metal wirings 25, in a region other than the chip superimposition region within the pixel region 31 and in the same layer as the metal wirings 25 formed in the chip superimposition region. Therefore, as depicted in FIG. 3, in a case where light incident on the imaging element chip 11 falls on the wiring layer 27 through the semiconductor substrate 21, reflection by the metal wirings 25 and reflection by the dummy vias 62 equally occur on the semiconductor substrate 21 side of the bonding surfaces between the imaging element chip 11 and the device chips. This results in uniform light reflection.

Figures 4A, 4B:
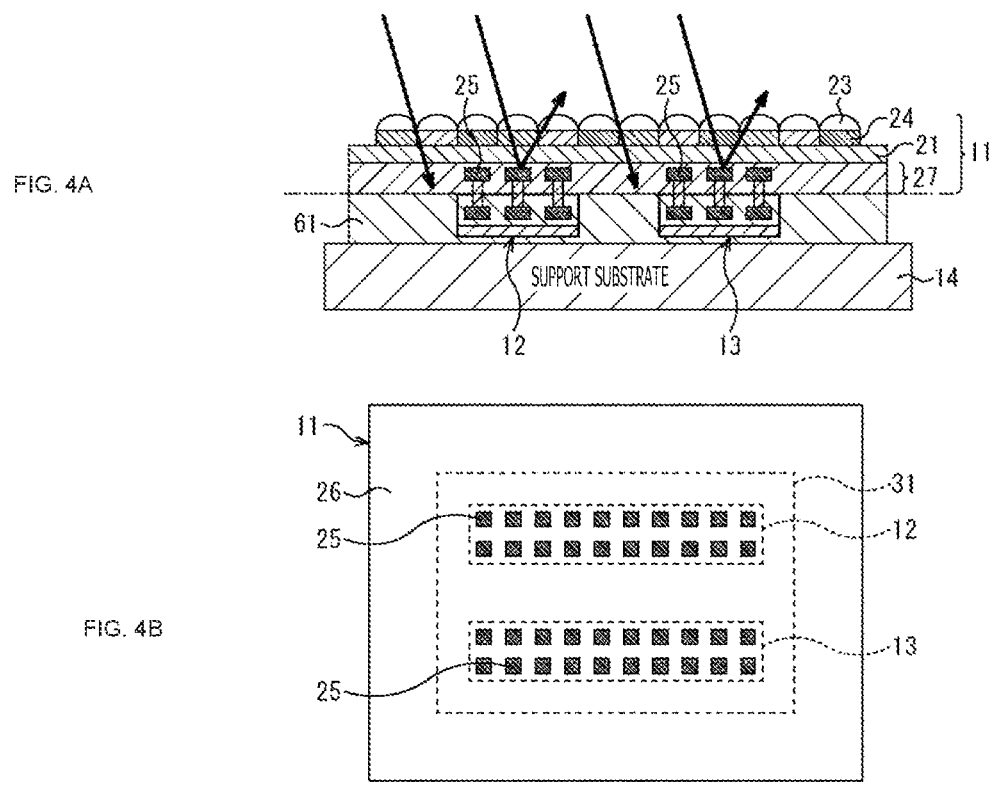

Meanwhile, in a case where the metal wirings 25 are formed in the chip superimposition region within the pixel region 31 and the dummy vias 62 are not formed in a region other than the chip superimposition region as indicated in FIGS. 4A and 4B, the reflection of light differs between a region where the logic chip 12 and the memory chip 13 exist and a region where the logic chip 12 and the memory chip 13 do not exist, as indicated by arrows in FIG. 4A. This results in nonuniform reflection of light incident on the semiconductor substrate 21, and thus affects an electric charge generated in the photoelectric conversion section.

The solid-state imaging apparatus 1 depicted in FIG. 1 is configured such that the metal wirings 25 and the dummy vias 62 are formed, with the same plane size and the same pitch, in the whole pixel region 31. Therefore, the solid-state imaging apparatus 1 is able to suppress nonuniform reflection of incident light and thus provide uniform light reflection. As a result, high-quality imaging signals are obtained.

2. Manufacturing Method of Solid-State Imaging Apparatus

A manufacturing method of the solid-state imaging apparatus 1 depicted in FIG. 1 will now be described with reference to FIGS. 5A, 5B, 5C, 5D, 5E, 6A, 6B, 6C, 6D, and 6E.

The solid-state imaging apparatus 1 depicted in FIG. 1 is manufactured by using a CoW (Chip on Wafer) technology that bonds and layers the individualized logic chip 12 and memory chip 13 to the imaging element chip 11 in a wafer state and then individualizes the imaging element chip 11 in the wafer state. FIGS. 5A, 5B, 50, 5D, 5E, 6A, 6B, 6C, 6D, and 6E depict a portion of the imaging element chip 11 in the wafer state that corresponds to two of the imaging element chips 11.

Figures 5A, 5B, 5C, 5D, 5E:
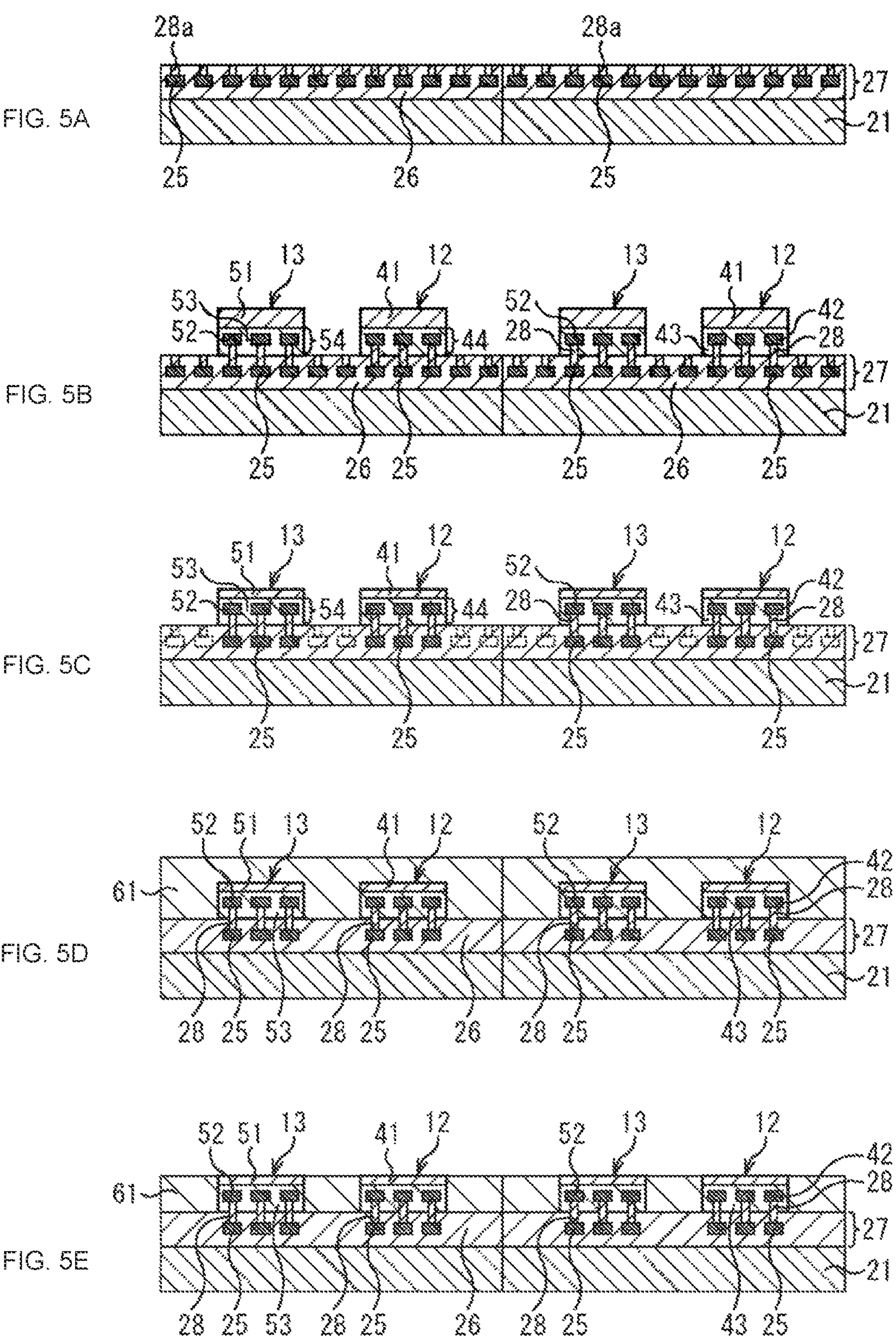
FIGS. 5A, 5B, 5C, 5D, and 5E are set of diagrams illustrating a manufacturing method of the solid-state imaging apparatus depicted in FIG. 1.

First of all, as indicated in FIG. 5A, the wiring layer 27 is formed toward the front surface of the semiconductor substrate 21 in the wafer state which will act as the imaging element chip 11. The wiring layer 27 includes the metal wiring 25, the insulating layer 26, and a contact wiring 28*a*. The contact wiring 28*a* is a portion of the contact wiring 28 depicted in FIG. 1 that is positioned toward the imaging element chip 11. The metal wiring 25 and the contact wiring 28*a* are formed, for example, by a metal material such as copper (Cu), tungsten (W), aluminum (Al), or gold (Au). The insulating layer 26 is formed, for example, by a SiO2 film, a Low-k film (low dielectric constant insulating film), or a SiOC film. In the present embodiment, it is assumed that the metal wiring 25 and the contact wiring 28*a* are formed by using copper (Cu) and that the insulating layer 26 is formed by using a SiO2 film.

It should be noted that, although not depicted in FIG. 5A, the photodiode 22 is formed pixel by pixel on a portion of the semiconductor substrate 21 in a state depicted in FIG. 5A that corresponds to the pixel region 31 of the imaging element chip 11.

Next, as indicated in FIG. 5B, the logic chip 12 and memory chip 13 manufactured in a separate process are bonded to predetermined chip regions of the semiconductor substrate 21 in the wafer state. More specifically, a contact wiring 28*b*, the metal wiring 42, and the wiring layer 44 including the insulating layer 43 are formed on one surface (front surface) of the semiconductor substrate 41 which configures the logic chip 12. Further, the contact wiring 28*b*, the metal wiring 52, and the wiring layer 54 including the insulating layer 53 are formed on one surface (front surface) of the semiconductor substrate 51 which configures the memory chip 13. The contact wiring 28*b* is a portion of the contact wiring 28 depicted in FIG. 1 that is positioned toward the logic chip 12 or the memory chip 13. A material similar to that of the metal wiring 25 and contact wiring 28*a* may be used for the contact wiring 28*b*, the metal wiring 42, and the metal wiring 52. Furthermore, a material similar to that of the insulating layer 26 can be used for the insulating layer 43 and the insulating layer 53.

Then, the contact wiring 28*b* in the wiring layer 44 of the logic chip 12 and the contact wiring 28*a* in the wiring layer 27 of the semiconductor substrate 21 are connected by Cu—Cu bonding, and the insulating layer 43 of the wiring layer 44 and the insulating layer 26 of the wiring layer 27 are connected by oxide film bonding. Further, the contact wiring 28*b* in the wiring layer 54 of the memory chip 13 and the contact wiring 28*a* in the wiring layer 27 of the semiconductor substrate 21 are connected by Cu—Cu bonding, and the insulating layer 53 of the wiring layer 44 and the insulating layer 26 of the wiring layer 27 are connected by oxide film bonding. The contact wiring 28 depicted in FIG. 1 is formed by the contact wiring 28*a* positioned toward the semiconductor substrate 21 and the contact wiring 28*b* positioned toward the logic chip 12 or the memory chip 13. The metal wiring 42 in the wiring layer 44 of the logic chip 12 is connected, by pasting, to the metal wiring 25 of the semiconductor substrate 21 (imaging element chip 11) which is disposed at a position facing the metal wiring 42 through the use of the contact wiring 28. The metal wiring 52 in the wiring layer 54 of the memory chip 13 is connected to the metal wiring 25 of the semiconductor substrate 21

(imaging element chip 11) which is disposed at a position facing the metal wiring 52 through the use of the contact wiring 28. It should be noted that the present embodiment uses copper as the material for the contact wiring 28 and the metal wiring 25. Therefore, Cu—Cu bonding is performed for metallic bonding. However, in a case where gold (Au) is used as the material for the contact wiring 28 and the metal wiring 25, Au—Au bonding is performed.

Subsequently, as indicated in FIG. 5C, the upper surfaces of the semiconductor substrates 41 and 51 are polished after the logic chip 12 and the memory chip 13 are attached to the semiconductor substrates 41 and 51. This results in thinning the semiconductor substrates 41 and 51. After being thinned in the above manner, the semiconductor substrates 41 and 51 are cleaned with an FPM (hydrofluoric acid hydrogen peroxide mixture) cleaning solution. The contact wiring 28*a* and the metal wiring 25 in a region where neither the logic chip 12 nor the memory chip 13 is bonded disappear when the semiconductor substrates 41 and 51 are cleaned with the FPM cleaning solution.

Next, as indicated in FIG. 5D, the insulating layer 61 greater in thickness than the logic chip 12 and the memory chip 13 is formed on the upper surface of the wiring layer 27. The insulating layer 61 is first embedded in a region (cavity) where neither the logic chip 12 nor the memory chip 13 is formed, and then is thickened until it is higher than the logic chip 12 and the memory chip 13. The insulating layer 61 is formed, for example, by an oxide film (SiO2).

Subsequently, as indicated in FIG. 5E, the insulating layer 61 is thinned, for example, by CMP (chemical mechanical polishing) until it is flush with the logic chip 12 and the memory chip 13, and then is flattened.

Figures 6A, 6B, 6C, 6D, 6E:
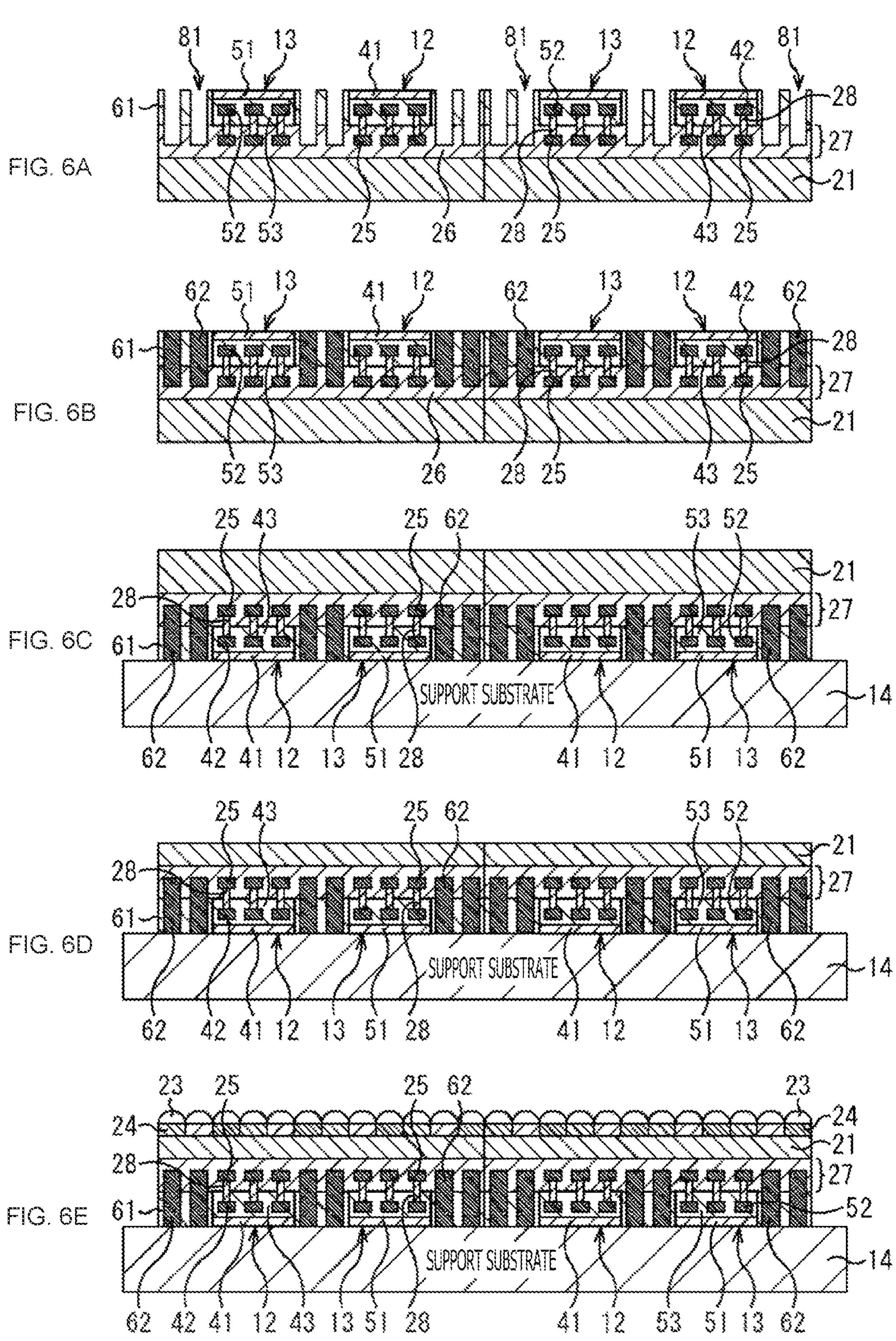
FIGS. 6A, 6B, 6C, 6D, and 6E are set of diagrams illustrating the manufacturing method of the solid-state imaging apparatus depicted in FIG. 1.

Next, as indicated in FIG. 6A, the insulating layers 61 and 26 at predetermined positions outside a region where the logic chip 12 and the memory chip 13 are disposed are removed by using a lithography technique or by etching in order to form an opening 81. The multiple openings 81 are formed, with the same plane size and the same pitch as the metal wiring 25 formed in the insulating layer 26 of the semiconductor substrate 21, at the same depth as the bottom surface of the metal wiring 25 (the surface toward the semiconductor substrate 21).

Next, as indicated in FIG. 6B, copper (Cu) is embedded in each of the multiple openings 81 formed in the insulating layers 61 and 26 in order to form the dummy via 62. For example, a method described below can be used for embedding copper (Cu). First of all, a sputtering method is used to form a barrier metal film and a Cu seed layer for electroplating. The Cu seed layer is reinforced as needed by using, for example, an electroless plating method. Subsequently, after copper is filled into each opening 81 by using an electroplating method, excess copper is removed by the CMP method to form the dummy via 62.

Next, as indicated in FIG. 6C, the semiconductor substrate 21 in the wafer state, to which the logic chip 12 and the memory chip 13 are attached, is inverted, and the rear surfaces of the insulating layer 61, dummy via 62, logic chip 12, and memory chip 13 are bonded to the support substrate 14.

Next, as indicated in FIG. 6D, the semiconductor substrate 21 in the wafer state is thinned until the photodiode 22 (not depicted) formed in each chip region of the semiconductor substrate 21 is in the vicinity of the interface.

Finally, as indicated in FIG. 6E, the on-chip lens 23 and the color filter 24 are formed pixel by pixel toward the back surface of the thinned semiconductor substrate 21. The imaging element chip 11 in the wafer state is now complete.

When the imaging element chip 11 in the wafer state which is depicted in FIG. 6E is individualized chip by chip, the solid-state imaging apparatus 1 depicted in FIG. 1 is obtained.

The method of forming the dummy via 62 will now be further described with reference to FIGS. 7A, 7B, 7C, 7D, and 7E.

FIGS. 7A, 7B, 7C, 7D, and 7E are set of enlarged cross-sectional views of the vicinity of the side surface end of the logic chip 12, illustrating processes depicted in FIGS. 5A, 5B, 5C, 5D, 5E, 6A, and 6B.

Figures 7A, 7B, 7C, 7D, 7E:
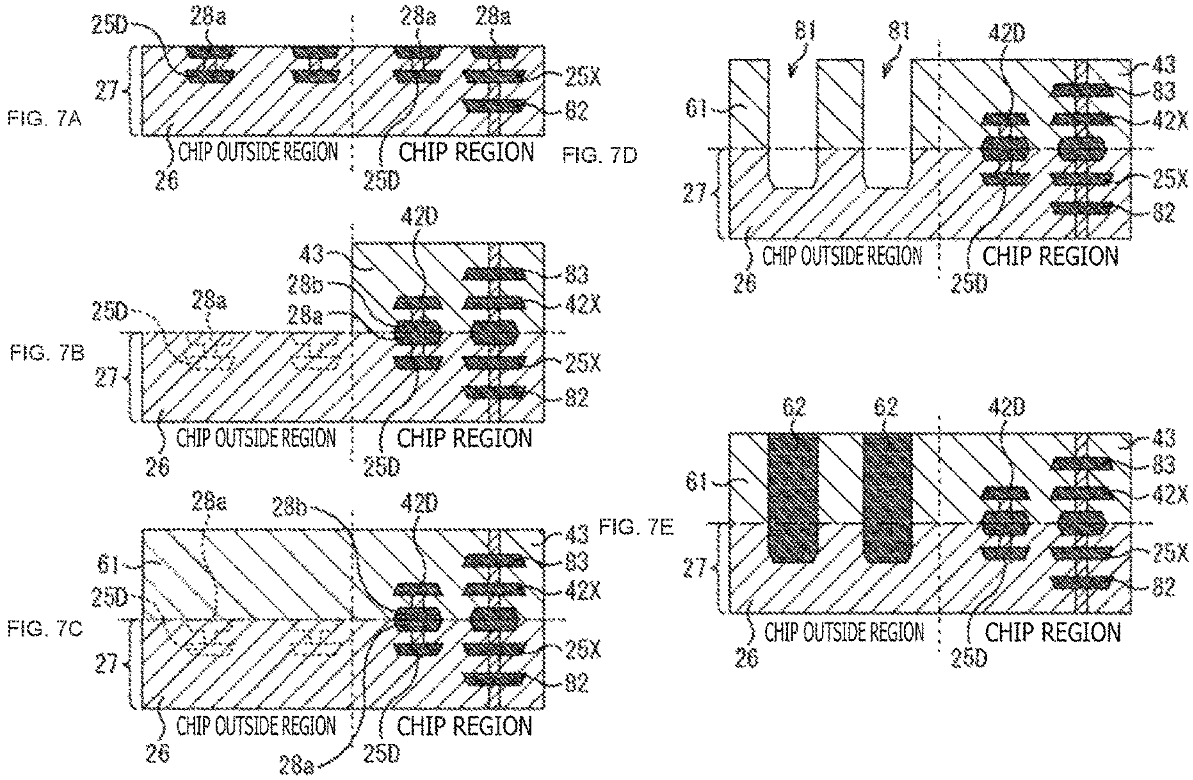
FIGS. 7A, 7B, 7C, 7D, and 7E are set of diagrams illustrating the details of the manufacturing method of the solid-state imaging apparatus depicted in FIG. 1.

FIG. 7A corresponds to the process depicted in FIG. 5A. In FIG. 7A, the multiple metal wirings 25 and the multiple contact wirings 28*a* are formed, with the same plane size and the same pitch, on the insulating layer 26 positioned toward the front surface of the semiconductor substrate 21 (not depicted). The multiple formed metal wirings 25 and the multiple formed contact wirings 28*a* are either connection wirings for transmitting and receiving power or signals between the imaging element chip 11 and the logic chip 12 or dummy wirings that do not transmit and receive power or signals between the imaging element chip 11 and the logic chip 12. In FIG. 7A, the rightmost metal wiring 25X is a connection wiring for transmitting and receiving power or signals to and from the logic chip 12 through the contact wiring 28*a* and is electrically connected to a metal wiring 82 in a different layer within the wiring layer 27. The other three metal wirings 25D are dummy wirings that are not connected to the metal wiring 82 in the different layer.

FIG. 7B corresponds to a process depicted in FIG. 5C. In FIG. 7B, the logic chip 12 and memory chip 13 manufactured in a separate process are attached to a predetermined chip region of the semiconductor substrate 21 in the wafer state. In this instance, the contact wiring 28*a* positioned toward the semiconductor substrate 21 and the contact wiring 28*b* positioned toward the logic chip 12 are connected by Cu—Cu bonding. Further, the insulating layer 26 positioned toward the semiconductor substrate 21 and the insulating layer 43 positioned toward the logic chip 12 are connected by oxide film bonding. Furthermore, the metal wiring 42 positioned toward the logic chip 12 is either a metal wiring 42X or a metal wiring 42D. The metal wiring 42X transmits and receives power or signals to and from the imaging element chip 11. The metal wiring 42D does not transmit and receive power or signals to and from the imaging element chip 11. The metal wiring 42X is connected to a metal wiring 83 in a different layer within the wiring layer 44.

After the semiconductor substrate 41 of the logic chip 12 and the semiconductor substrate 51 of the memory chip 13 are thinned, FPM cleaning is performed. As indicated in FIG. 7B, performing FPM cleaning removes the contact wiring 28*a* and metal wirings 25D in a region where neither the logic chip 12 nor the memory chip 13 is bonded. FIG. 7B depicts a state where the insulating layer 26 which is an oxide film is embedded in the region from which the contact wiring 28*a* and the metal wirings 25D are removed.

FIG. 7C corresponds to processes depicted in FIGS. 5D and 5E. As indicated in FIG. 7C, the insulating layer 61 which is an oxide film is formed over the insulating layer 26 in the region where neither the logic chip 12 nor the memory chip 13 is formed.

FIG. 7D corresponds to a process depicted in FIG. 6A. As indicated in FIG. 7D, the opening 81 is formed in a location where the metal wirings 25D which are dummy wirings included in the insulating layer 26 in the region where neither the logic chip 12 nor the memory chip 13 is formed.

FIG. 7E corresponds to a process depicted in FIG. 6B. As indicated in FIG. 7E, the dummy via 62 is formed by embedding copper (Cu) in each of multiple openings 81 formed in the insulating layers 61 and 26. The dummy vias 62 formed outside the chip regions of the logic chip 12 and memory chip 13 are formed with the same plane size and the same pitch as the metal wirings 25X and 25D formed in the chip regions of the logic chip 12 and memory chip 13.

As described above, the dummy vias 62 outside the chip superimposition region within the pixel region 31 are formed with the same plane size and the same pitch as the metal wirings 25X and 25D formed in the chip superimposition region.

3. Modification of First Embodiment

Figure 8:
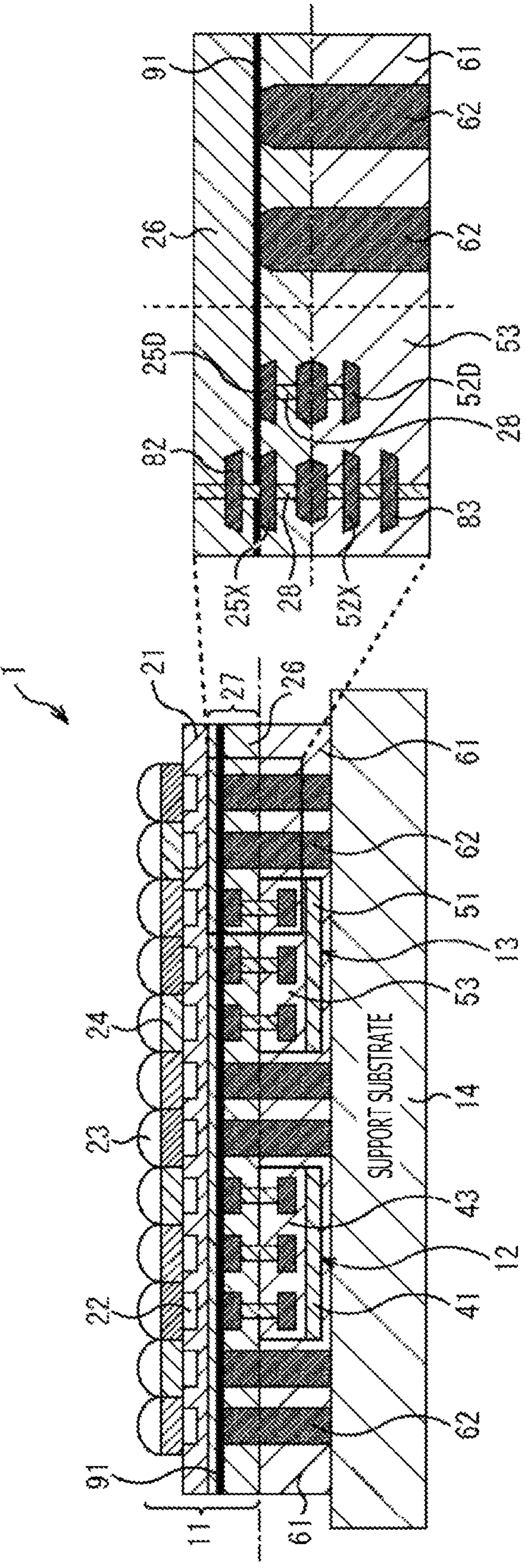
FIG. 8 is a cross-sectional view illustrating the solid-state imaging apparatus depicted in FIG. 1 according to a modification of the first embodiment.

FIG. 8 is a cross-sectional view illustrating the solid-state imaging apparatus depicted in FIG. 1 according to a modification of the first embodiment.

Component elements corresponding to those in the first embodiment which is described earlier are designated by the same reference signs as their counterparts in the first embodiment and will not be redundantly described.

In the modification of the first embodiment which is depicted in FIG. 8, a stopper film 91 is newly formed on a plane corresponding to line A-A' in FIG. 1, that is, on the upper surfaces (the surfaces toward the semiconductor substrate 21) of the metal wirings 25 (25X and 25D) and dummy vias 62 formed with the same plane size and the same pitch. For example, a SiCN film, a SiOC film, or a SiN film may be used as the stopper film 91. In the modification of the first embodiment, it is assumed that the SiCN film is used as the stopper film 91. The solid-state imaging apparatus 1 according to the modification depicted in FIG. 8 is similar in configuration to the solid-state imaging apparatus 1 depicted in FIG. 1 except that the stopper film 91 is added to the upper surfaces of the metal wirings 25 and dummy vias 62.

The upper surfaces of the metal wirings 25 and dummy vias 62 act as reflective surfaces for reflecting incident light that passes through the semiconductor substrate 21 and falls on the wiring layer 27. The stopper film 91 formed in the above manner can maintain the flatness of the upper surfaces of the metal wirings 25 and dummy vias 62. This results in providing more uniform light reflection and suppressing nonuniform reflection of incident light.

In a case where the stopper film 91 is formed in the wiring layer 27 of the solid-state imaging apparatus 1, the metal wirings 25 and the contact wiring 28*a* are formed after the stopper film 91 is formed in the process depicted in FIG. 5A. The stopper film 91 ensures that the bottom surfaces of the metal wirings 25 depicted in FIG. 5A are flush with the bottom surfaces of the openings 81 depicted in FIG. 6A. Therefore, the light reflecting surfaces of the metal wirings 25 and dummy vias 62 are formed flat.

4. Second Embodiment of Solid-State Imaging Apparatus

Figure 9A:
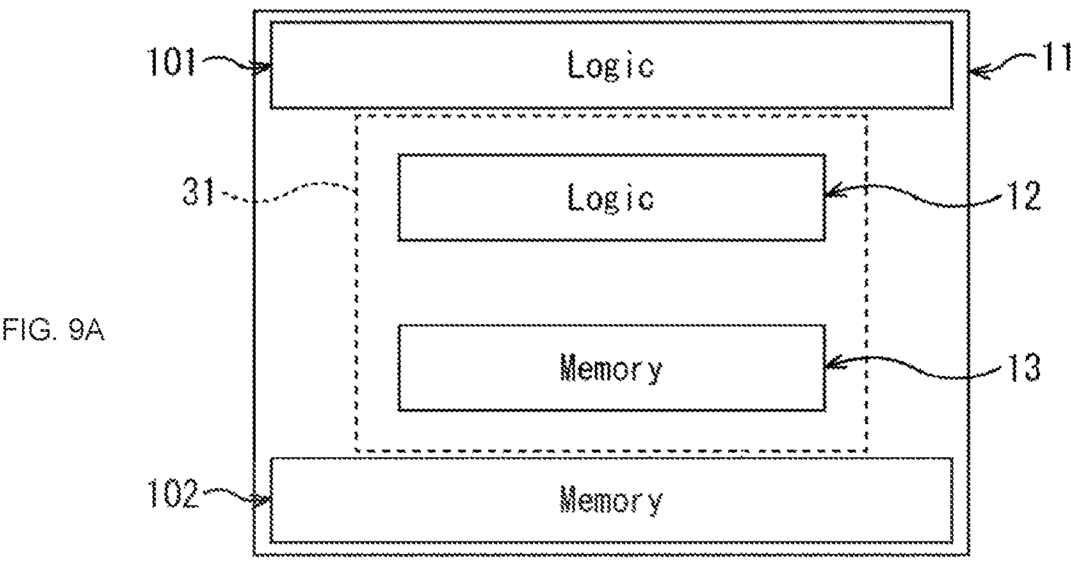
FIGS. 9A and 9B are set of plan views illustrating the solid-state imaging apparatus according to a second embodiment of the present disclosure.
Figure 9B:
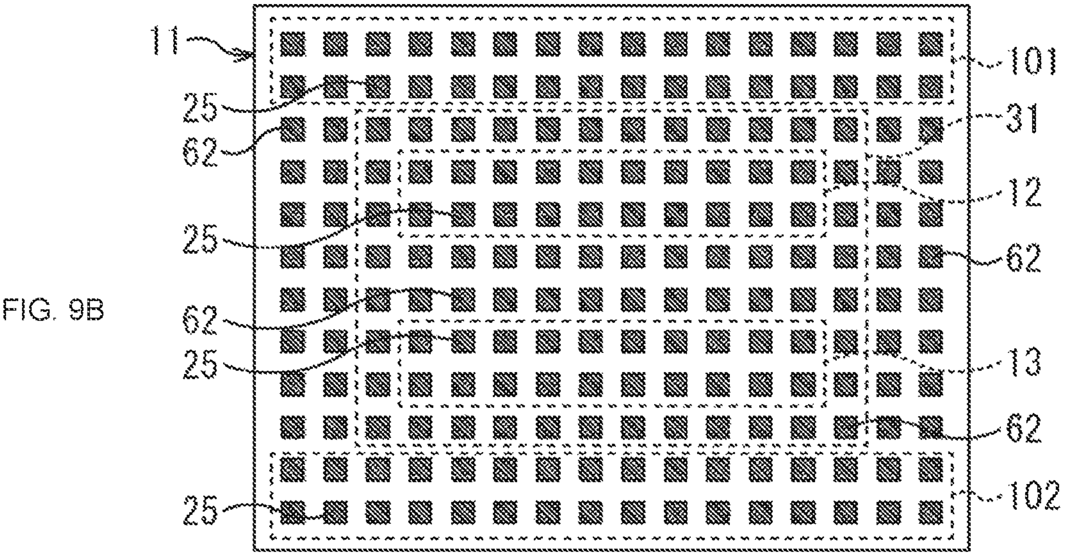

FIGS. 9A and 9B are set of plan views illustrating the solid-state imaging apparatus according to a second embodiment of the present disclosure.

FIGS. 9A and 9B correspond to the plan views in FIGS. 2A and 2B which depict the first embodiment. The cross-sectional view of the solid-state imaging apparatus 1 according to the second embodiment is omitted.

As depicted in FIG. 9A, the solid-state imaging apparatus 1 according to the second embodiment is configured such that a logic chip 101 and a memory chip 102 are disposed in a peripheral region outside the pixel region 31 of the imaging element chip 11. The logic chip 101 and the memory chip 102 are sub-chips separate from the logic chip 12 and the memory chip 13.

As indicated by the plan view in FIG. 9B which corresponds to line A-A' in FIG. 1, the multiple metal wirings 25 are formed in a region where the logic chip 101 and the memory chip 102 are disposed. The metal wirings 25 in the region where the logic chip 101 and the memory chip 102 are disposed are formed with the same plane size and the same pitch as the metal wirings 25 in the pixel region 31. The metal wirings 25 in the region where the logic chip 101 and the memory chip 102 are disposed are similar to the case of the logic chip 12 and memory chip 13 in that some of the metal wirings 25 are connection wirings for transmitting and receiving power or signals to and from the imaging element chip 11 while the rest of the metal wirings 25 are dummy wirings which do not transmit and receive power or signals.

Further, in a portion of the peripheral region outside the pixel region 31 of the imaging element chip 11 where the logic chip 101 and the memory chip 102 are not disposed, the dummy vias 62 are formed with the same plane size and the same pitch as the metal wirings 25. The region occupied by the dummy vias 62 (the coverage of the dummy vias 62) within a peripheral region other than the chip superimposition region is equivalent (equal within the manufacturing error margin) to a region occupied by the metal wirings 25 (the coverage of the metal wirings 25) in the chip superimposition region within the peripheral region.

Consequently, as indicated in FIG. 9B, the wiring layer 27 of the semiconductor substrate 21 includes either the metal wirings 25 or the dummy vias 62 which are formed, with the same plane size and the same pitch, on the whole surface of the plane region of the semiconductor substrate 21, no matter whether the sub-chips are included in the wiring layer 27 and located inside or outside the pixel region 31.

The solid-state imaging apparatus 1 according to the second embodiment is also able to avoid nonuniform reflection of light irrespective of the presence of the sub-chips in a case where the sub-chips are disposed in the peripheral region outside the pixel region 31 of the imaging element chip 11. As a result, high-quality imaging signals can be obtained.

5. Third Embodiment of Solid-State Imaging Apparatus

Figure 10:
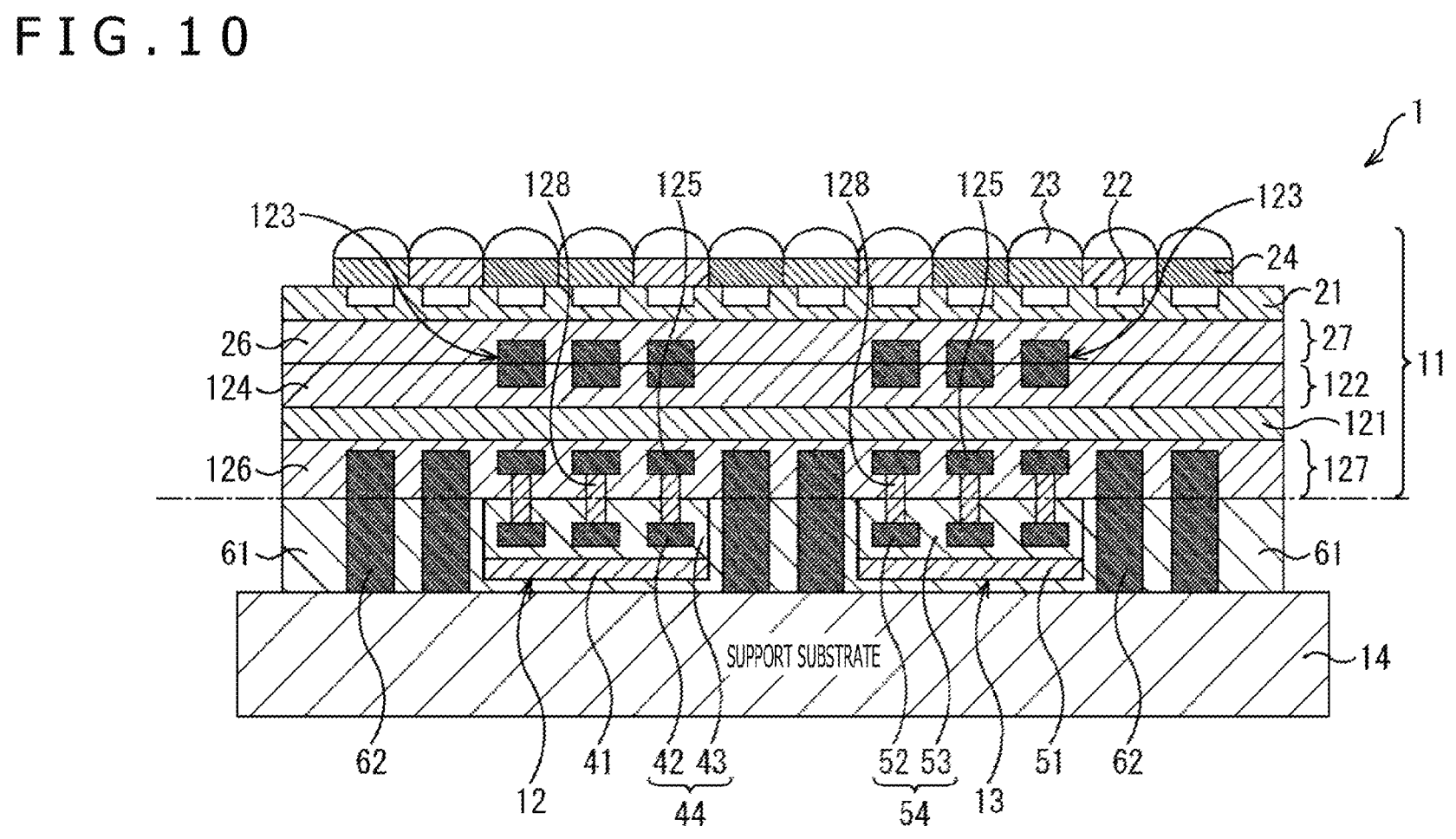

FIG. 10 is a cross-sectional view illustrating the solid-state imaging apparatus according to a third embodiment of the present disclosure.

In the description of the third embodiment which is depicted in FIG. 10, component elements corresponding to those in the first embodiment which is depicted in FIG. 1 are also designated by the same reference signs as their counterparts in the first embodiment and will not be redundantly described.

The first embodiment which is depicted in FIG. 1 is configured such that the imaging element chip 11 is formed by using one semiconductor substrate 21. Meanwhile, the third embodiment which is depicted in FIG. 10 is configured such that the imaging element chip 11 is formed by using a two-layer structure having two semiconductor substrates, namely, the semiconductor substrate 21 and a semiconductor substrate 121.

More specifically, the on-chip lens 23 and the color filter 24 are formed pixel by pixel toward the light incident surface of the semiconductor substrate 21, as is the case with the first embodiment. The wiring layer 27 including at least the insulating layer 26 is formed toward the circuit formation surface of the semiconductor substrate 21. Further, a wiring layer 122 including at least an insulating layer 124 is formed toward the light incident surface of the semiconductor substrate 121. The semiconductor substrates 21 and 121 are electrically connected at a predetermined spot by Cu—Cu bonding 123 which uses a metal wiring including copper (Cu).

Furthermore, a wiring layer 127 including a metal wiring 125 and an insulating layer 126 is formed toward the circuit formation surface of the semiconductor substrate 121. The metal wiring 125 in the wiring layer 127 is connected through a contact wiring 128 to the metal wiring 42 of the logic chip 12 which is disposed at a position facing the metal wiring 125. Moreover, the metal wiring 125 in the wiring layer 127 is connected through the contact wiring 128 to the metal wiring 52 of the memory chip 13 which is disposed at a position facing the metal wiring 125.

The insulating layer 61 and the dummy vias 62 are embedded between the semiconductor substrate 121 and the support substrate 14 except for the region where the logic chip 12 and the memory chip 13 are connected. The dummy vias 62 are formed with the same plane size and the same pitch (interval) as the metal wiring 125 formed in the wiring layer 127 of the semiconductor substrate 121.

The solid-state imaging apparatus 1 according to the third embodiment is also configured such that, in a region other than the chip superimposition region within the pixel region 31 where the logic chip 12 and the memory chip 13 are disposed, the dummy vias 62 are formed so as to have the same plane size and the same pitch as the metal wiring 125 formed in the chip superimposition region. This ensures that the reflection caused by the metal wiring 125 is equivalent to the reflection caused by the dummy vias 62 wirings. Therefore, uniform light reflection can be provided. As a result, nonuniform reflection of incident light can be suppressed to obtain high-quality imaging signals.

The modification depicted in FIG. 8 can also be applied to the solid-state imaging apparatus 1 according to the third embodiment. More specifically, the solid-state imaging apparatus 1 depicted in FIG. 10 can also be configured such that the stopper film 91 is added to the upper surfaces of the metal wiring 125 and dummy vias 62 which are formed with the same plane size and the same pitch.

Further, as is the case with the second embodiment depicted in FIGS. 9A and 9B, the solid-state imaging apparatus 1 depicted in FIG. 10 can also be configured such that sub-chips other than the logic chip 12 and the memory chip 13 can be bonded to the peripheral region outside the pixel region 31 to form the dummy vias 62, with the same plane size and the same pitch as the metal wiring 125, in a region where no sub-chip is disposed.

The solid-state imaging apparatus 1 according to the third embodiment has been described on the assumption that the imaging element chip 11 is configured by using the two-layer structure having two semiconductor substrates, namely, the semiconductor substrate 21 and the semiconductor substrate 121. However, the imaging element chip 11 may alternatively be configured by using a multi-layer structure having three or more semiconductor substrates.

6. Example Uses of Image Sensor

Figure 11:
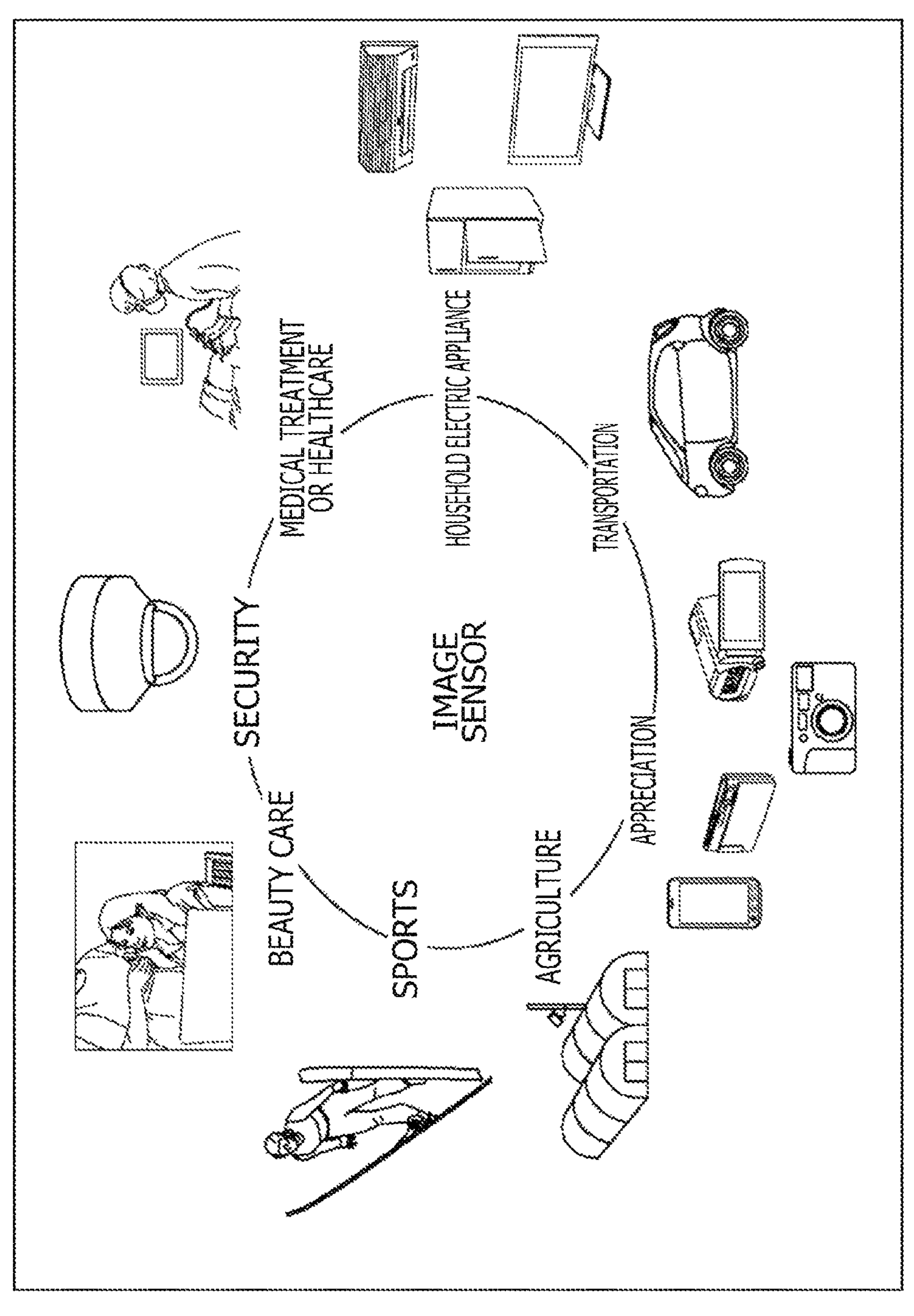
FIG. 11 is a diagram illustrating example uses of an image sensor.

FIG. 11 is a diagram illustrating example uses of an image sensor that uses the above-described solid-state imaging apparatus 1.

The image sensor using the above-described solid-state imaging apparatus 1 can be utilized in various cases where, for example, visible light, infrared light, ultraviolet light, or X-rays are to be sensed as described below.

- An apparatus used to capture images for appreciation, such as a digital camera or a mobile device with a camera function
- An apparatus used for transportation, for example, to provide an automatic stop feature and other safety driving features and recognize the status of a driver of a vehicle, such as a vehicle-mounted sensor for capturing an image depicting, for instance, a forward or rearward view from the vehicle, a view around the vehicle, or the interior of the vehicle, a surveillance camera for monitoring traveling vehicles and roads, or a distance measurement sensor for measuring, for example, an inter-vehicle distance
- An apparatus used with a TV set, a refrigerator, an air conditioner, or other household electric appliance in order to capture an image of a user's gesture and operate such an electric appliance according to the gesture
- An apparatus used with an endoscope, an angiographic instrument adapted to receive infrared light, or other medical treatment of healthcare instrument
- An apparatus used for security purposes, such as a surveillance camera for crime prevention or a camera for personal authentication
- An apparatus used for beauty care, such as a skin measuring instrument for capturing an image of skin or a microscope for capturing an image of a scalp
- An apparatus used for sports, such as an action camera or a wearable camera for sporting and other events
- An apparatus used for agriculture, such as a camera for monitoring farm and crop conditions

7. Example Applications to Electronic Equipment

The application of the technology according to the present disclosure is not limited to a solid-state imaging apparatus. More specifically, the technology according to the present disclosure is applicable to electronic equipment as a whole, as long as it uses a solid-state imaging apparatus as an image acquisition section (photoelectric conversion element), such as a digital still camera, a video camera, or other imaging apparatus, a mobile terminal device having an imaging function, or a copier that uses a solid-state imaging apparatus as an image reading section. The solid-state imaging apparatus may be in a single-chip form or in a module form obtained by combining an imaging section and a signal processing section or an optical system into a package to perform an imaging function.

Figure 12:
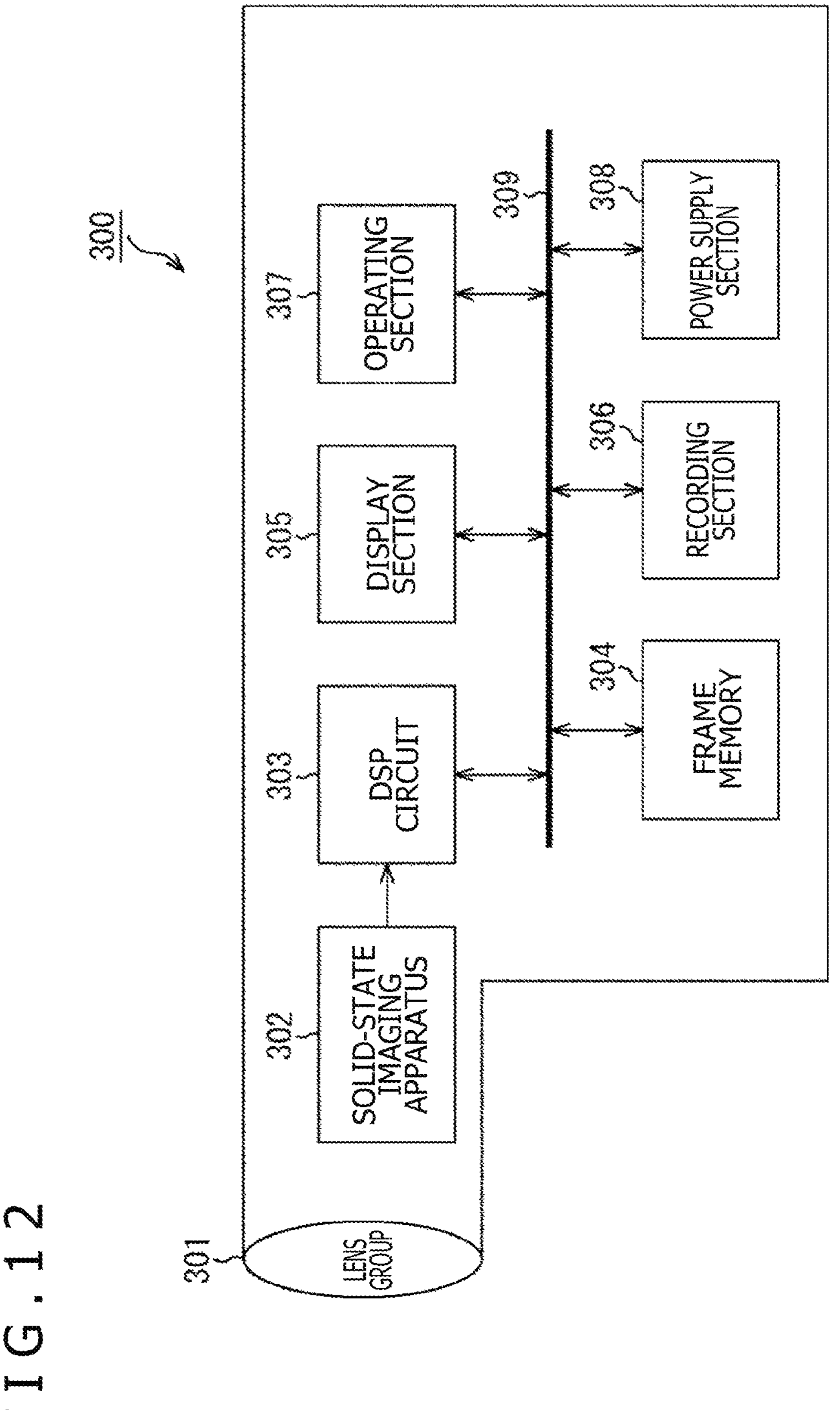
FIG. 12 is a block diagram illustrating an example configuration of an imaging apparatus that is used as electronic equipment to which a technology according to the present disclosure is applied.

FIG. 12 is a block diagram illustrating an example configuration of an imaging apparatus that is used as electronic equipment to which the technology according to the present disclosure is applied.

The imaging apparatus 300 depicted in FIG. 12 includes an optical section 301, a solid-state imaging apparatus (imaging device) 302, and a DSP (Digital Signal Processor) circuit 303. The optical section 301 includes, for example, a lens group. The solid-state imaging apparatus adopts the configuration of the solid-state imaging apparatus 1 depicted in FIG. 1. The DSP circuit 303 is a camera signal processing circuit. Further, the imaging apparatus 300 additionally includes a frame memory 304, a display section 305, a recording section 306, an operating section 307, and a power supply section 308. The DSP circuit 303, the frame memory

304, the display section 305, the recording section 306, the operating section 307, and the power supply section 308 are interconnected through a bus line 309.

The optical section 301 receives incident light (image light) from a subject and forms an image on the imaging surface of the solid-state imaging apparatus 302. The solid-state imaging apparatus 302 obtains a pixel signal by converting the amount of incident light which is used by the optical section 301 to form the image on the imaging surface to an electrical signal pixel by pixel, and outputs the obtained pixel signal. It is possible to use, as the solid-state imaging apparatus 302, the solid-state imaging apparatus 1 depicted in FIG. 1, namely, the solid-state imaging apparatus configured such that the dummy vias 62 are disposed in a region other than the chip superimposition region within the pixel region 31 and are formed so as to have the same plane size and the same pitch as the metal wirings 25 formed in the chip superimposition region.

The display section 305 includes, for example, a thin display, such as an LCD (Liquid Crystal Display) or an organic EL (Electro Luminescence) display, and displays a moving or still image captured by the solid-state imaging apparatus 302. The recording section 306 records the moving or still image which is captured by the solid-state imaging apparatus 302 in a recording medium such as a hard disk or a semiconductor memory.

The operating section 307 issues operation commands regarding various functions of the imaging apparatus 300 according to user operations. The power supply section 308 supplies various types of power to the DSP circuit 303, the frame memory 304, the display section 305, the recording section 306, and the operating section 307 as needed for their operations.

As described above, when the above-described solid-state imaging apparatus 1 is used as the solid-state imaging apparatus 302, nonuniform reflection of incident light can be suppressed to provide uniform reflection of the incident light. This improves the quality of captured images even when they are captured by the imaging apparatus 300 used in a video camera, a digital still camera, or a camera module for a mobile phone or other mobile device.

8. Example Applications to Mobile Bodies

The technology according to the present disclosure is applicable to various products. For example, the technology according to the present disclosure may be implemented as an apparatus that is to be mounted in any one of various types of mobile bodies such as automobiles, electric automobiles, hybrid electric automobiles, motorcycles, bicycles, personal mobility devices, airplanes, drones, ships, and robots.

FIG. 13 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 13, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automated driving, which makes the vehicle to travel automatedly without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 13, an audio speaker 12061, a display section 12062, and an instrument panel 12063 are illustrated as the output device. The display section 12062 may, for example, include at least one of an on-board display and a head-up display.

Figure 14:
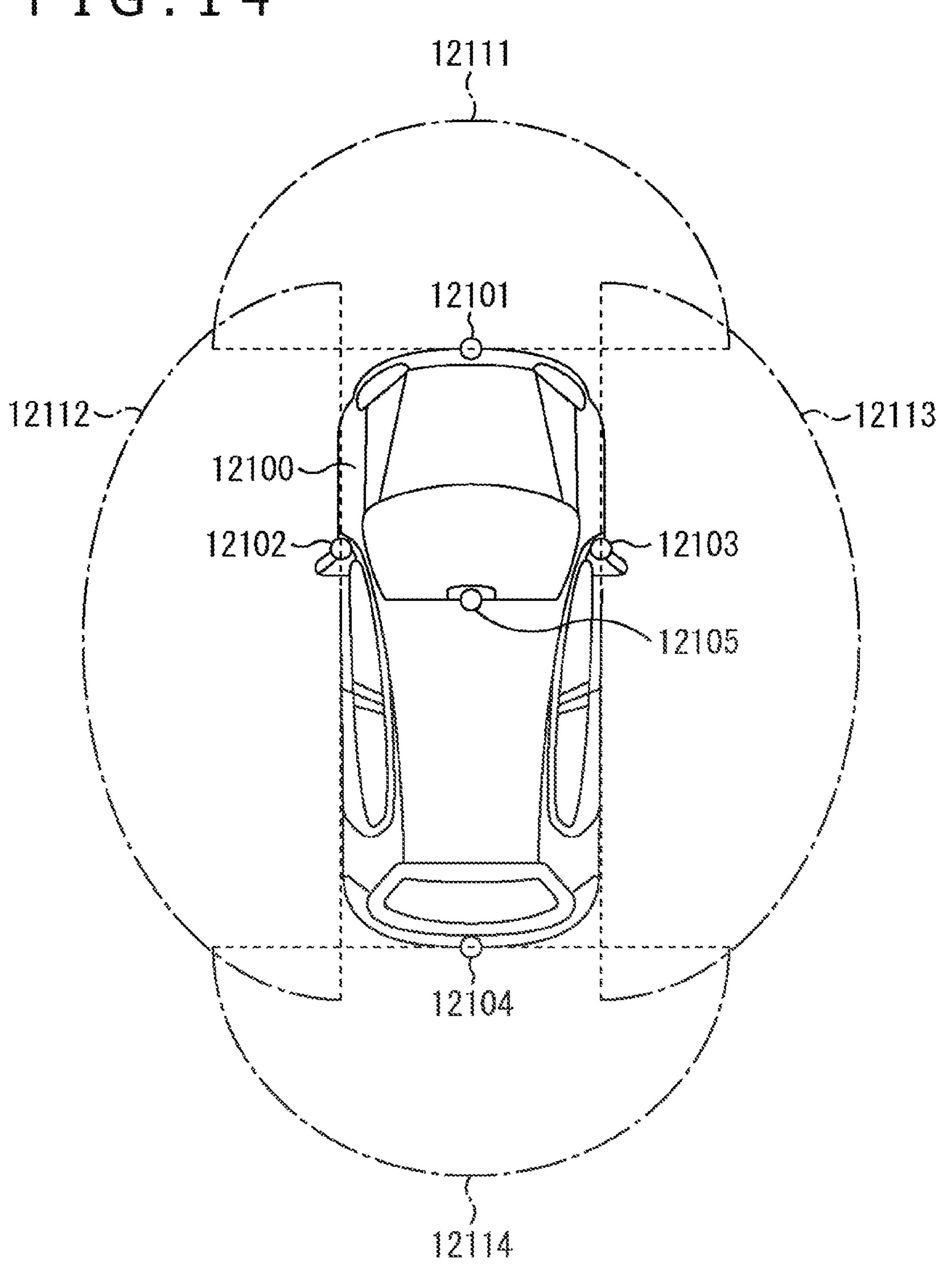
FIG. 14 is a diagram of assistance in explaining an example of installation positions of an outside-vehicle information detecting section and an imaging section.

FIG. 14 is a diagram depicting an example of the installation position of the imaging section 12031.

In FIG. 14, the imaging section 12031 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Incidentally, FIG. 14 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automated driving that makes the vehicle travel automatedly without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

An example of the vehicle control system to which the technology according to the present disclosure is applicable has been described above. The technology according to the present disclosure is applicable to the imaging section 12031 which is one of the component elements described above. More specifically, the above-described solid-state imaging apparatus 1 can be applied as the imaging section 12031. Applying the technology according to the present disclosure to the imaging section 12031 makes it possible to obtain captured images of high quality and generate distance information from the captured images. Further, the obtained captured images and distance information can be used to reduce the fatigue of a vehicle driver and increase the safety of a vehicle and vehicle driver.

The embodiments according to the present disclosure are not limited to the foregoing embodiments and may be variously modified without departing from the spirit and scope of the present disclosure.

For example, the foregoing embodiments are configured such that, as depicted in the enlarged cross-sectional views of FIGS. 7A, 7B, 7C, 7D, and 7E, the dummy vias 62 are disposed in the layer of the metal wiring 25 closest to the bonding surfaces between the imaging element chip 11 and the device chips (logic chip 12 and memory chip 13) so as to have the same plane size and the same pitch as the metal wiring 25. However, the dummy vias 62 may alternatively be disposed in a layer other than the layer of the metal wiring 25 closest to the bonding surfaces, namely, in the layer of a metal wiring 25 that is one of the multiple metal wirings 25 and positioned closer to the semiconductor substrate 21, so as to have the same plane size and the same pitch as the metal wiring 25. That is, the dummy vias 62 is only required to be disposed so as to have the same plane size and the same pitch as a separate metal wiring 25 in the same layer without regard to the layer position of the metal wiring 25. Another alternative is to dispose the dummy vias 62 in such a manner that they have the same plane size and the same pitch as the contact wiring 28*a* which is Cu—Cu bonded to the bonding surfaces between the imaging element chip 11 and the device chips.

For example, the first and second embodiments have been described above on the assumption that two device chips are disposed in the pixel region 31 of the imaging element chip 11. However, the number of device chips disposed in the pixel region 31 may alternatively be one or three or more. Further, the number of device chips disposed in the peripheral region outside the pixel region 31 may alternatively be one or three or more. Moreover, the type (functionality) of device chip does not matter.

Advantages described in this document are merely illustrative and not restrictive. The present disclosure can additionally provide advantages other than those described in this document.

It should be noted that the technology according to the present disclosure may adopt the following configurations.

(1)

A solid-state imaging apparatus including:

an imaging element chip that has a semiconductor substrate; and a device chip that is bonded to a wiring layer opposite a light incident surface of the semiconductor substrate, in which the device chip is disposed in a pixel region of the imaging element chip, and the wiring layer of the imaging element chip includes a dummy metal wiring that is positioned in a region where the device chip of the pixel region is not disposed.

(2)

The solid-state imaging apparatus according to (1) above, in which the dummy metal wiring is disposed in the same layer as a metal wiring formed in a region where the device chip in the pixel region is disposed.

(3)

The solid-state imaging apparatus according to (2) above, in which the metal wiring of the pixel region includes a connection wiring and a dummy wiring, the connection wiring being configured to transmit and receive power or signals to and from a wiring layer of the device chip, the dummy wiring being configured to not transmit and receive the power or the signals.

(4)

The solid-state imaging apparatus according to (2) or (3) above, in which the dummy metal wiring is disposed in a whole region where the device chip of the pixel region is not disposed and is formed with the same plane size and the same pitch as the metal wiring.

(5)

The solid-state imaging apparatus according to any one of (2) to (4) above, in which percentage of area occupied by the dummy metal wiring in a region where the device chip of the pixel region is not disposed is equivalent to percentage of area occupied by the metal wiring in a region where the device chip of the pixel region is disposed.

(6)

The solid-state imaging apparatus according to any one of (2) to (5) above, in which the dummy metal wiring and the metal wiring are disposed in a layer that is disposed away from the bonding surfaces between the imaging element chip and the device chip and toward the semiconductor substrate.

(7)

The solid-state imaging apparatus according to (6) above, in which the bonding surfaces between the imaging element chip and the device chip are connected by metal bonding.

(8)

The solid-state imaging apparatus according to any one of (2) to (7) above, in which the wiring layer further includes a stopper film that is disposed on surfaces of the dummy metal wiring and metal wiring and is positioned toward the semiconductor substrate.

(9)

The solid-state imaging apparatus according to any one of (1) to (8) above, in which the multiple device chips are bonded to the wiring layer of the semiconductor substrate.

(10)

The solid-state imaging apparatus according to any one of (2) to (9) above, in which the device chips of different types are additionally bonded to a peripheral region outside the pixel region of the imaging element chip.

(11)

The solid-state imaging apparatus according to (10) above, in which the wiring layer of the imaging element chip includes the dummy metal wiring even in a region where the device chip of the peripheral region is not disposed.

(12)

The solid-state imaging apparatus according to (11) above, in which the dummy metal wiring of the peripheral region is formed with the same plane size and the same pitch as the dummy metal wiring of the pixel region.

(13)

The solid-state imaging apparatus according to (11) or (12) above, in which percentage of area occupied by the dummy metal wiring in a region where the device chip of the peripheral region is not disposed is equivalent to percentage of area occupied by the metal wiring in a region where the device chip of the peripheral region is disposed.

(14)

The solid-state imaging apparatus according to any one of (1) to (13) above, in which the imaging element chip is configured by layering two or more of the semiconductor substrates.

(15)

A manufacturing method of a solid-state imaging apparatus, including:

bonding a device chip to a pixel region of a wiring layer opposite a light incident surface of a semiconductor substrate for an imaging element chip; and forming a dummy metal wiring in a region where the device chip of the pixel region is not disposed.

(16)

Electronic equipment including:

a solid-state imaging apparatus that includes an imaging element chip and a device chip, the imaging element chip having a semiconductor substrate, the device chip being bonded to a wiring layer opposite a light incident surface of the semiconductor substrate, in which the device chip is disposed in a pixel region of the imaging element chip, and the wiring layer of the imaging element chip includes a dummy metal wiring in a region where the device chip of the pixel region is not disposed.

REFERENCE SIGNS LIST

1: Solid-state imaging apparatus
11: Imaging element chip
12: Logic chip
13: Memory chip
14: Support substrate
21: Semiconductor substrate
22: Photodiode
23: On-chip lens
24: Color filter
25, 25D, 25X: Metal wiring
26: Insulating layer
27: Wiring layer
28, 28*a*, 28*b*: Contact wiring
31: Pixel region
41: Semiconductor substrate
42, 42D, 42X: Metal wiring
43: Insulating layer
44: Wiring layer
51: Semiconductor substrate
52: Metal wiring
53: Insulating layer
54: Wiring layer
61: Insulating layer
62: Dummy via
82: Metal wiring
83: Metal wiring
91: Stopper film
101: Logic chip
102: Memory chip
121: Semiconductor substrate
122: Wiring layer
123: Cu bonding
124: Insulating layer
125: Metal wiring
126: Insulating layer
127: Wiring layer
128: Contact wiring
300: Imaging apparatus
302: Solid-state imaging apparatus

The invention claimed is:

1. A solid-state imaging apparatus, comprising:

an imaging element chip that includes a first semiconductor substrate;

a wiring layer opposite to a light incident surface of the first semiconductor substrate, wherein the wiring layer includes a dummy metal wiring and a metal wiring; and a first device chip bonded to the wiring layer, wherein the first device chip is in a pixel region of the imaging element chip, and the dummy metal wiring is in a region where the first device chip of the pixel region is not disposed.

2. The solid-state imaging apparatus according to claim 1, wherein the dummy metal wiring is in a same layer as the metal wiring in a region where the first device chip in the pixel region is disposed.

3. The solid-state imaging apparatus according to claim 2, wherein the metal wiring of the pixel region includes a connection wiring and the dummy metal wiring, the connection wiring is configured to transmit and receive power or signals to and from the wiring layer of the first device chip, and the dummy metal wiring is configured to not transmit and receive the power or the signals.

4. The solid-state imaging apparatus according to claim 2, wherein the dummy metal wiring is in a whole region where the first device chip of the pixel region is not disposed, and the dummy metal wiring is of a same plane size and a same pitch as the metal wiring.

5. The solid-state imaging apparatus according to claim 2, wherein percentage of area occupied by the dummy metal wiring in a first region where the first device chip of the pixel region is not disposed is equivalent to percentage of area occupied by the metal wiring in a second region where the first device chip of the pixel region is disposed.

6. The solid-state imaging apparatus according to claim 2, wherein the dummy metal wiring and the metal wiring are in a layer that is away from bonding surfaces between the imaging element chip and the first device chip and toward the first semiconductor substrate.

7. The solid-state imaging apparatus according to claim 6, wherein the bonding surfaces between the imaging element chip and the first device chip are connected by metal bonding.

8. The solid-state imaging apparatus according to claim 2, wherein the wiring layer further includes a stopper film that is on surfaces of the dummy metal wiring and the metal wiring, and the stopper film is toward the first semiconductor substrate.

9. The solid-state imaging apparatus according to claim 1, wherein a plurality of device chips are bonded to the wiring layer of the first semiconductor substrate, and the plurality of device chips includes the first device chip.

10. The solid-state imaging apparatus according to claim 2, further comprising a plurality of device chips, wherein the plurality of device chips is of different types, the plurality of device chips includes the first device chip, and the plurality of device chips is additionally bonded to a peripheral region outside the pixel region of the imaging element chip.

11. The solid-state imaging apparatus according to claim 10, wherein the wiring layer of the imaging element chip includes the dummy metal wiring in a region where the first device chip of the peripheral region is not disposed.

12. The solid-state imaging apparatus according to claim 11, wherein the dummy metal wiring of the peripheral region is of a same plane size and a same pitch as the dummy metal wiring of the pixel region.

13. The solid-state imaging apparatus according to claim 11, wherein percentage of area occupied by the dummy metal wiring in a region where the first device chip of the peripheral region is not disposed is equivalent to percentage of area occupied by the metal wiring in a region where the first device chip of the peripheral region is disposed.

14. The solid-state imaging apparatus according to claim 1, wherein the imaging element chip further includes two or more semiconductor substrates in a stacked configuration, and the two or more semiconductor substrates include the first semiconductor substrate.

15. A manufacturing method of a solid-state imaging apparatus, the manufacturing method comprising:

bonding a device chip to a pixel region of a wiring layer opposite a light incident surface of a semiconductor substrate for an imaging element chip; and forming a dummy metal wiring in a region where the device chip of the pixel region is not disposed, wherein the wiring layer includes the dummy metal wiring and a metal wiring.

16. An electronic equipment, comprising:

a solid-state imaging apparatus that includes an imaging element chip, a wiring layer, and a device chip, wherein the imaging element chip includes a semiconductor substrate, the wiring layer is opposite to a light incident surface of the semiconductor substrate, the wiring layer includes a dummy metal wiring and a metal wiring, the device chip is bonded to the wiring layer, the device chip is in a pixel region of the imaging element chip, and the dummy metal wiring is in a region where the device chip of the pixel region is not disposed.

* * * * *